United States Patent
Yamashita

(10) Patent No.: US 9,325,322 B2
(45) Date of Patent: Apr. 26, 2016

(54) SYNCHRONIZATION SYSTEM AND FREQUENCY DIVIDER CIRCUIT

(71) Applicant: MegaChips Corporation, Osaka (JP)

(72) Inventor: Kazunori Yamashita, Chiba (JP)

(73) Assignee: MEGACHIPS CORPORATION, Osaka (JP)

( * ) Notice: Subject to any disclaimer, the term of this patent is extended or adjusted under 35 U.S.C. 154(b) by 99 days.

(21) Appl. No.: 14/481,470

(22) Filed: Sep. 9, 2014

(65) Prior Publication Data
US 2015/0070054 A1 Mar. 12, 2015

(30) Foreign Application Priority Data

Sep. 9, 2013 (JP) ................................. 2013-186344

(51) Int. Cl.
*H03B 19/00* (2006.01)
*H03K 21/02* (2006.01)
*H03L 7/24* (2006.01)

(52) U.S. Cl.
CPC . *H03K 21/02* (2013.01); *H03L 7/24* (2013.01)

(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS

| | | | | |
|---|---|---|---|---|
| 6,181,174 B1 * | 1/2001 | Fujieda | ..................... | G06F 1/08 327/158 |
| 6,194,916 B1 * | 2/2001 | Nishimura | ........... | G01R 25/005 327/107 |
| 6,958,635 B2 * | 10/2005 | Fahim | ..................... | G06F 1/022 327/155 |
| 7,508,273 B2 * | 3/2009 | Redman-White | ...... | H03K 23/68 327/115 |
| 8,085,070 B2 * | 12/2011 | Wu | ........................... | G06F 1/08 327/147 |
| 2005/0180539 A1 * | 8/2005 | De Gouy | ............... | H03K 23/68 377/47 |
| 2008/0018374 A1 * | 1/2008 | Fujii | ......................... | G06F 1/08 327/291 |
| 2014/0003569 A1 * | 1/2014 | Martin | ................... | H03K 21/08 377/48 |
| 2015/0070054 A1 * | 3/2015 | Yamashita | ............... | H03L 7/24 327/117 |
| 2015/0288367 A1 * | 10/2015 | Kim | ....................... | H02M 3/07 327/117 |

FOREIGN PATENT DOCUMENTS

| JP | 6-056954 B2 | 7/1994 |
|---|---|---|
| JP | 2008-028854 A | 2/2008 |

* cited by examiner

*Primary Examiner* — Brandon S Cole
(74) *Attorney, Agent, or Firm* — Osha Liang LLP

(57) ABSTRACT

In a synchronization system, a frequency divider circuit generates a divided clock by dividing a reference clock in a first division ratio. First and second devices operate in synchronization with the reference clock and the divided clock. A division ratio detection circuit, for each period of the divided clock, detects a division ratio of the divided clock based on a count value counted in synchronization with the reference clock and output the division ratio as a second division ratio. A decoder generates a strobe signal, which is for controlling a timing at which the first device transmits and receives a signal to and from the second device, based on the count value and the second division ratio. The first device communicates with the second device through a bus, which operates in synchronization with the divided clock, based on the strobe signal.

10 Claims, 15 Drawing Sheets

SYNCHRONIZATION SYSTEM AND FREQUENCY DIVIDER CIRCUIT

CROSS-REFERENCE TO RELATED APPLICATIONS

The present application claims priority under 35 U.S.C. §119 to Japanese Patent Application No. 2013-186344, filed Sep. 9, 2013. The above application is hereby expressly incorporated by reference, in its entirety, into the present application.

BACKGROUND OF THE INVENTION

Embodiments of the invention relate to a synchronization system and a frequency divider circuit that generates a divided clock used in the synchronization system.

FIG. 13 is a block diagram showing an example of the configuration of the conventional synchronization system 80. The synchronization system 80 shown in FIG. 13 includes a first device 82, a second device 84, a frequency divider circuit 88, and a decoder 92.

The first device 82 operates in synchronization with a reference clock (clk_PLL) supplied from a clock generation circuit, such as a phase locked loop (PLL) 93, and the second device 84 operates in synchronization with a divided clock generated by dividing the reference clock (clk_PLL) through the frequency divider circuit 88.

The division ratio of the divided clock can be changed by a first division ratio set by a division ratio setting signal (div_ratio) input from the outside.

Hereinafter, the frequency divider circuit 88 will be described.

FIG. 14 is a circuit diagram showing an example of the configuration of the frequency divider circuit 88 shown in FIG. 13. The frequency divider circuit 88 shown in FIG. 14 includes a selector 98, a flip-flop (FF) 100, a decrementer (−1) 102, and NOR circuit 104.

In the frequency divider circuit 88, when the output signal of the decrementer 102 becomes 0, the output signal of the NOR circuit 104 becomes a high level (H), and a first division ratio set by the division ratio setting signal (div_ratio [n:0]) is output from the selector 98. The first division ratio output from the selector 98 is set in the FF 100 in synchronization with a reference clock (clk_PLL), and a count value (count, downcount [n:0]) output from the FF 100 becomes the first division ratio.

Then, the count value output from the FF 100 is decremented (−1) by the decrementer 102. When the output signal of the decrementer 102 is not 0, the output signal of the decrementer 102 is output from the selector 98. The output signal from the selector 98 is set in the FF 100 in synchronization with the reference clock (clk_PLL), and the count value output from the FF 100 is counted down.

The count value is sequentially decremented, and is counted down from the first division ratio to 0 in synchronization with the reference clock (clk_PLL). Then, when the output signal of the decrementer 102 becomes 0, the first division ratio is set again to the count value, and the above-described operation is repeated. In the meantime, from the frequency divider circuit 88, the count value (count) of the FF 100 is output and the most significant bit (downcount [n]) is output as a divided clock (clk_DIV).

In the synchronization system 80, communication between the first device 82 and the second device 84 is performed through a bus 86 operating in synchronization with the divided clock. Typically, the divided clock itself is not input to the first device 82. Instead, strobe signals composed of an input strobe signal (strobe_sample) and an output strobe signal (strobe_drive) are input to the first device 82 from the decoder 92. These two strobe signals allow the first device 82 to normally communicate with the second device 84.

The input strobe signal is a signal for controlling the timing at which the first device 82 receives a signal input from the second device 84, whereas the output strobe signal is a signal for controlling the timing at which the first device 82 outputs a signal input to the second device 84.

As described above, the divided clock is generated by dividing the reference clock (clk_PLL). Accordingly, it is easiest to generate the input strobe signal and the output strobe signal by decoding the count value output from the frequency divider circuit 88. For this reason, the two strobe signals are generated by decoding the count value based on the first division ratio and the count value through the decoder 92.

In the synchronization system 80, as described above, the reference clock (clk_PLL) is divided by the frequency divider circuit 88 to generate the count value and the divided clock, the count value is decoded by the decoder 92 to generate the input strobe signal and the output strobe signal, and the first device 82 communicates with the second device 84 through the bus 86 based on the two strobe signals.

In the conventional synchronization system 80, however, there has been a problem in terms of timing closure.

FIG. 15 is a block diagram showing an example of the problem in the conventional synchronization system 80. As shown in FIG. 15, in the actual synchronization system 80, in order to reduce a clock skew between the first device 82 and the second device 84, clock tree synthesis (CTS) is usually performed in the paths of the reference clock (clk_PLL) and the divided clock, and a clock tree is inserted.

In this case, even if the phases of clocks between the first device 82 and the second device 84 coincide with each other, a clock skew between the count value output from the frequency divider circuit 88 and the reference clock (clk_PLL) input to the first device 82 is increased since the frequency divider circuit 88 is located near the root of the clock tree. Therefore, significant hold violation occurs between the frequency divider circuit 88 and the first device 82.

In addition, there is a disadvantage in terms of the number of pins when mounting the synchronization system 80. As shown by the dotted line in FIGS. 13 and 14, in a case where the frequency divider circuit 88 is mounted as a semiconductor chip different from other circuit portions, the division ratio setting signal and the count value output from the frequency divider circuit 88 need to be input to the decoder 92. Each of these signals is configured with multiple-bit, and accordingly, when the frequency divider circuit 88 is mounted as another semiconductor chip, a large number of pins are required.

Moreover, when changing the first division ratio set by the division ratio setting signal, it is necessary to change the first division ratio in synchronization with the reference clock (clk_PLL) in order to prevent a malfunction. Furthermore, if the cycle of the reference clock (clk_PLL) at which the first division ratio is changed is different in the frequency divider circuit 88 and the decoder 92, the synchronization system 80 malfunctions. Therefore, timing requirement for changing the first division ratio is very severe.

Here, as related prior art documents, JP 06-56954 B (Patent document 1) and JP 2008-28854 A (Patent document 2) are mentioned.

Patent document 1 describes that a synchronous clock is counted by a counting circuit, and in a case where the count values from 0 to 3 are repeatedly counted, a timing signal is generated when the count value becomes 3.

Patent document 2 describes that the number of pulse of a basic signal is counted during the time period corresponding to one period of the reference clock signal.

SUMMARY OF THE INVENTION

One or more embodiments of the invention provide a synchronization system and a frequency divider circuit, in which the occurrence of timing violation due to a clock skew between the frequency divider circuit and the first device of synchronization system can be prevented.

One or more embodiments of the invention provide a synchronization system and a frequency divider circuit, in which when the frequency divider circuit is mounted as another semiconductor chip, the number of pins for connection between the frequency divider circuit and other circuit portions can be reduced.

One or more embodiments of the invention provide a synchronization system and a frequency divider circuit, in which the problem of the timing when changing the division ratio of the divided clock can be solved.

In one or more embodiments of the invention, according to an aspect, there is provided a synchronization system comprising: a frequency divider circuit configured to generate a divided clock by dividing a reference clock in a first division ratio set by a division ratio setting signal; a first device configured to operate in synchronization with the reference clock; a second device configured to operate in synchronization with the divided clock; a division ratio detection circuit configured to, for each period of the divided clock, output a count value counted in synchronization with the reference clock, and to detect a division ratio of the divided clock based on the count value and output the division ratio as a second division ratio; and a decoder configured to generate a strobe signal, which is for controlling a timing at which the first device transmits and receives a signal to and from the second device, based on the count value and the second division ratio. The first device communicates with the second device through a bus, which operates in synchronization with the divided clock, based on the strobe signal.

According to another aspect, there is provided a frequency divider circuit used in the synchronization system described above.

According to still another aspect, there is provided a frequency divider circuit that generates a divided clock by dividing a reference clock in a first division ratio set by a division ratio setting signal. The frequency divider circuit comprises: a division ratio updating circuit configured to receive a first division ratio set by the division ratio setting signal at a timing controlled by a division ratio update signal; a division ratio changing circuit configured to change a third division ratio, which is a division ratio of the current divided clock, to the first division ratio received by the division ratio updating circuit; a first counter configured to output a count value, which is obtained by counting the third division ratio changed by the division ratio changing circuit, in synchronization with the reference clock; and a waveform shaping circuit configured to generate the divided clock having a duty of approximately 50% from the count value of the first counter. The division ratio changing circuit stepwisely reduces the third division ratio by n (n is an integer of 1 or more) until the third division ratio becomes a same as the first division ratio, for each predetermined period of the divided clock, when the first division ratio is smaller than the third division ratio, immediately changes the third division ratio to the first division ratio when the first division ratio is larger than the third division ratio, and does not change the third division ratio when the first division ratio is the same as the third division ratio.

According to one or more embodiments of the invention, the following effects can be obtained by detecting the division ratio of the divided clock generated by the frequency divider circuit using the division ratio detection circuit.

The division ratio detection circuit does not use the count value output from the first counter of the frequency divider circuit. In addition, the count value output from the second counter of the division ratio detection circuit is not involved in the generation of the divided clock. Therefore, even if CTS is performed in the configuration of this invention, a large clock skew does not occur between the division ratio detection circuit and the first device, and timing violation does not occur.

In one or more embodiments of the invention, in a case where the frequency divider circuit is mounted as a semiconductor chip different from other circuit portions, only two of the reference clock and the divided clock need to be connected between both circuits. Therefore, it is possible to reduce the number of pins for connection between chips, and this is advantageous in terms of chip size or substrate design.

In one or more embodiments of the invention, a division ratio setting signal is distributed only to the frequency divider circuit. Therefore, the division ratio setting signal has no connection with the division ratio detection circuit, and thus, it is possible to solve the problem of timing for changing the first division ratio.

DETAILED DESCRIPTION OF THE INVENTION

Hereinafter, a synchronization system and a frequency divider circuit according to one or more embodiments of the invention will be described in detail with reference to the accompanying diagrams.

Figure 1:
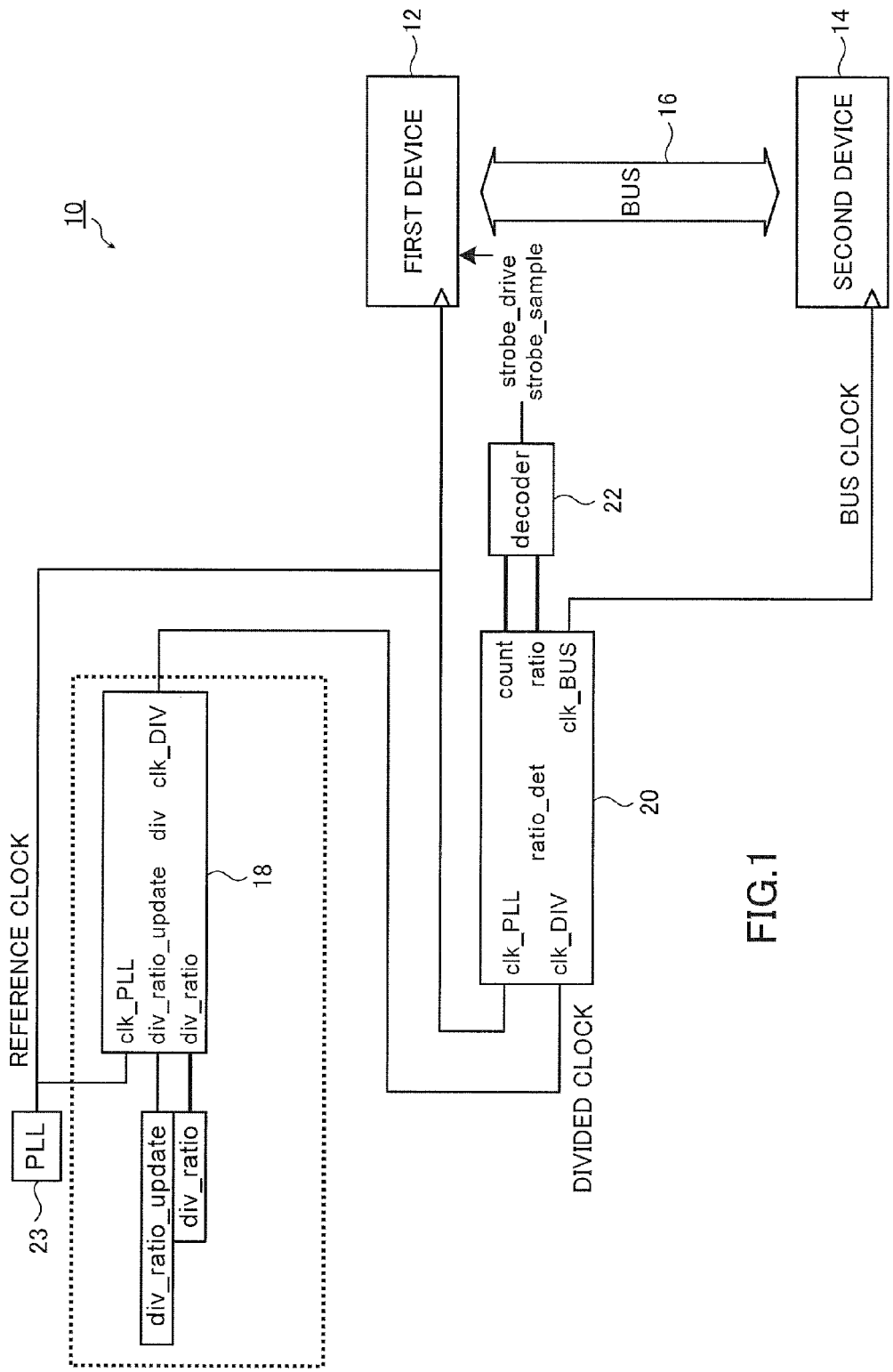
FIG. 1 is a block diagram showing the configuration of a synchronization system 10 according to one or more embodiments of the invention.
Figure 13:
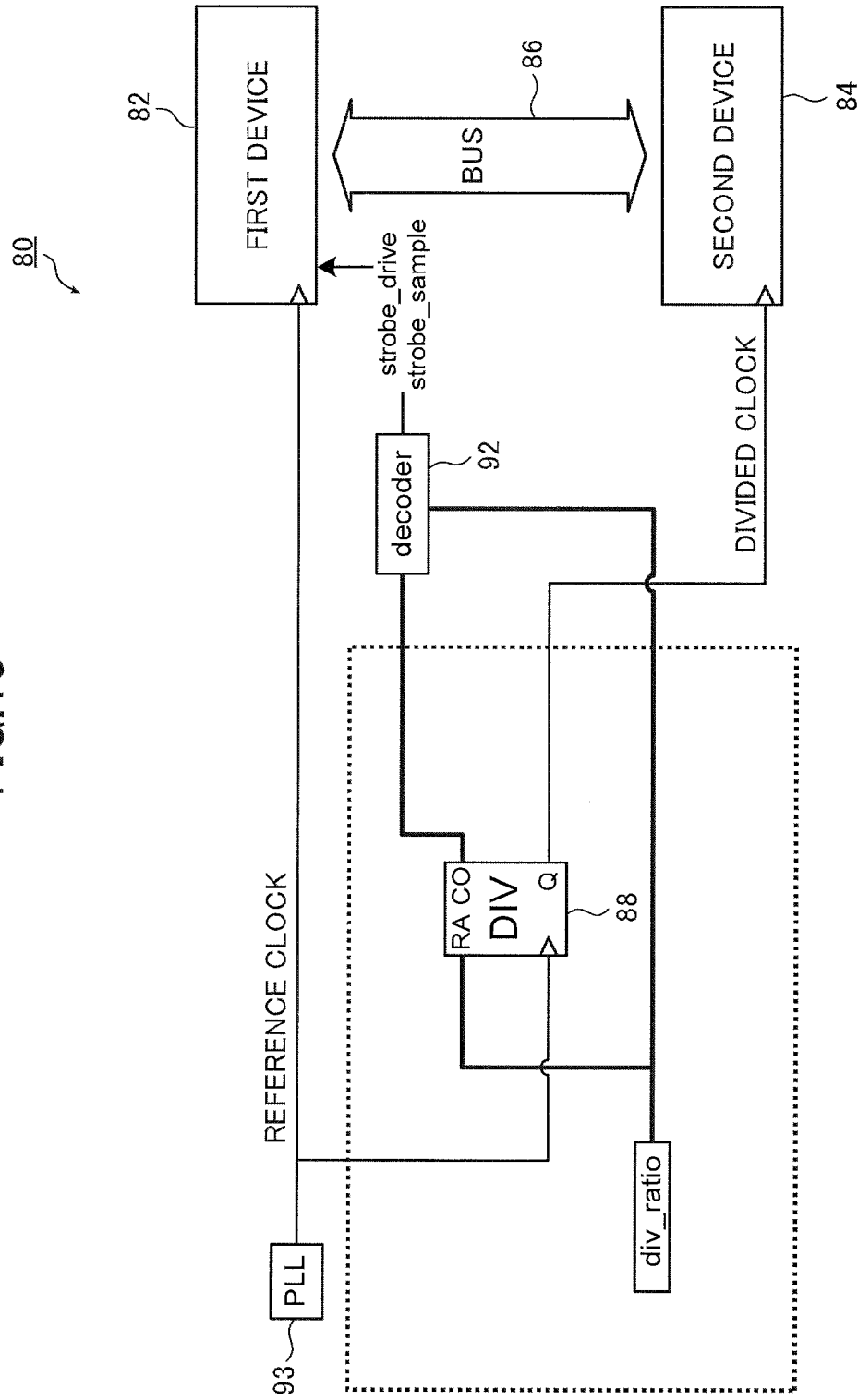
FIG. 13 is a block diagram showing an example of the configuration of the conventional synchronization system.
Figure 14:
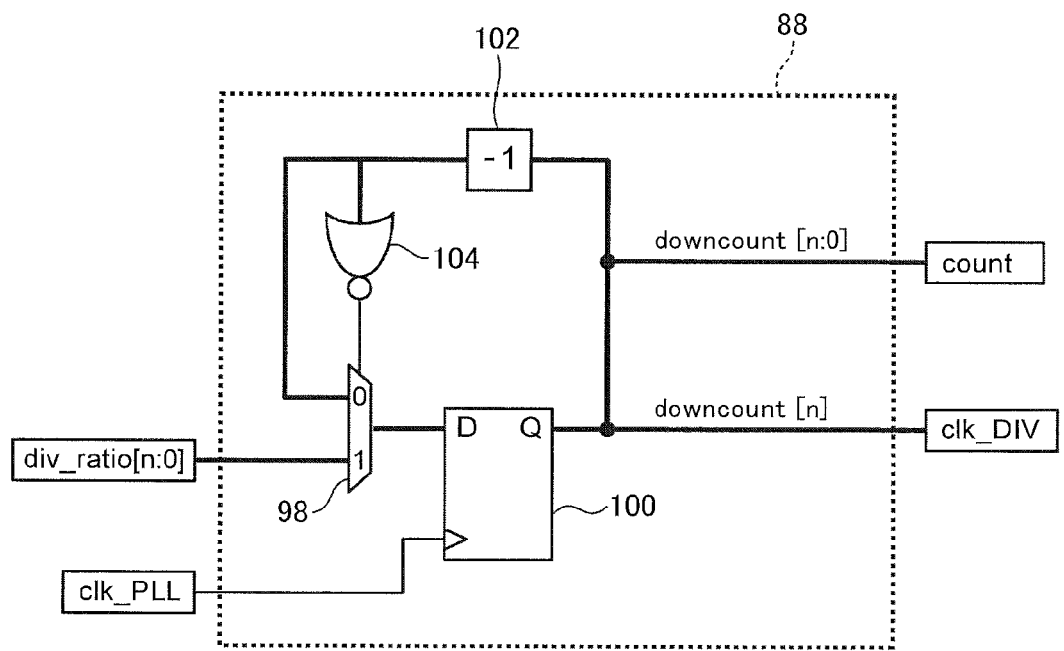
FIG. 14 is a circuit diagram showing an example of the configuration of a frequency divider circuit shown in FIG. 13.
Figure 15:
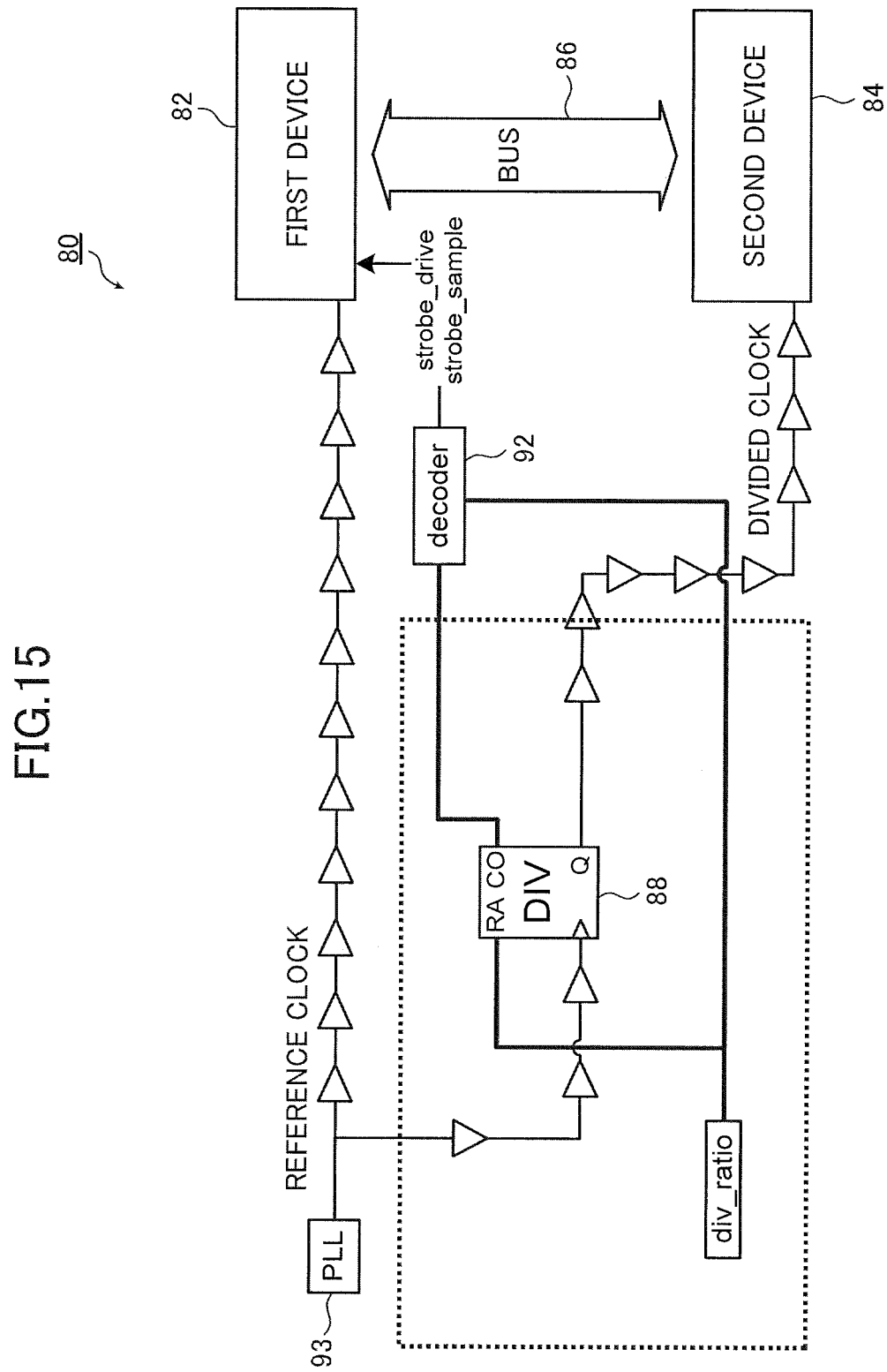
FIG. 15 is a block diagram showing an example of the problem of the conventional synchronization system.

FIG. 1 is a block diagram showing the configuration of a synchronization system 10 according to one or more embodiments of the invention. The synchronization system 10 shown in FIG. 1 is a synchronization system in which an embodiment of the present invention is applied to the conventional synchronization system 80 shown in FIG. 13.

The synchronization system 10 includes a first device 12, a second device 14, a frequency divider circuit (div) 18, a division ratio detection circuit (ratio_det) 20, and a decoder 22. In addition, a PLL 23 is also shown in the diagram.

A reference clock (clk_PLL) is input to the first device 12 from a clock generation circuit, such as the PLL 23, and an input strobe signal (strobe_sample) and an output strobe signal (strobe_drive) are input to the first device 12 from the decoder 22. A bus clock (clk_BUS) is input to the second device 14 from the division ratio detection circuit 20.

The first device 12 operates in synchronization with the reference clock (clk_PLL), and the second device 14 operates in synchronization with the bus clock (divided clock) that synchronizes with the reference clock (clk_PLL).

The first device 12 and the second device 14 are connected to each other through a bus 16 that operates in synchronization with the divided clock. The first device 12 communicates with the second device 14 through the bus 16 using the input strobe signal and the output strobe signal.

For example, the first device 12 is a microprocessor, and the second device is a peripheral device, such as a semiconductor memory. Therefore, it is possible to exemplify a synchronization system in which a microprocessor accesses a peripheral device through the bus 16.

Then, the reference clock (clk_PLL) is input to the frequency divider circuit 18 from the PLL 23, and a division ratio setting signal (div_ratio) and a division ratio update signal (div_ratio_update) are input to the frequency divider circuit 18 from the outside of the synchronization system 10.

The frequency divider circuit 18 receives a division ratio setting signal at a timing controlled by the division ratio update signal, and generates a divided clock (clk_DIV) by dividing the reference clock (clk_PLL) at a first division ratio set by the division ratio setting signal.

The division ratio of the divided clock can be changed to an arbitrary division ratio by the first division ratio, which is set by the division ratio setting signal, at an arbitrary timing controlled by the division ratio update signal.

Then, the reference clock (clk_PLL) is input to the division ratio detection circuit 20 from the PLL 23, and the divided clock (clk_DIV) is input to the division ratio detection circuit 20 from the frequency divider circuit 18.

For each period of the divided clock, the division ratio detection circuit 20 outputs a count value (count) counted in synchronization with the reference clock (clk_PLL), and also the division ratio detection circuit 20 detects the division ratio of the divided clock based on the count value and outputs it as a second division ratio (ratio). In addition, the division ratio detection circuit 20 outputs the bus clock (clk_BUS) obtained by delaying the divided clock.

Then, the count value (count) and the second division ratio (ratio) from the division ratio detection circuit 20 are input to the decoder 22.

Based on the count value and the second division ratio, the decoder 22 generates the input strobe signal (strobe_sample) and the output strobe signal (strobe_drive), that is, a strobe signal for controlling the timing at which the first device 12 transmits and receives a signal to and from the second device 14.

The input strobe signal is a signal for controlling the timing at which the first device 12 receives a signal input from the second device 14, and the output strobe signal is a signal for controlling the timing at which the first device 12 outputs a signal input to the second device 14.

Next, the frequency divider circuit 18 will be described.

Figure 2:
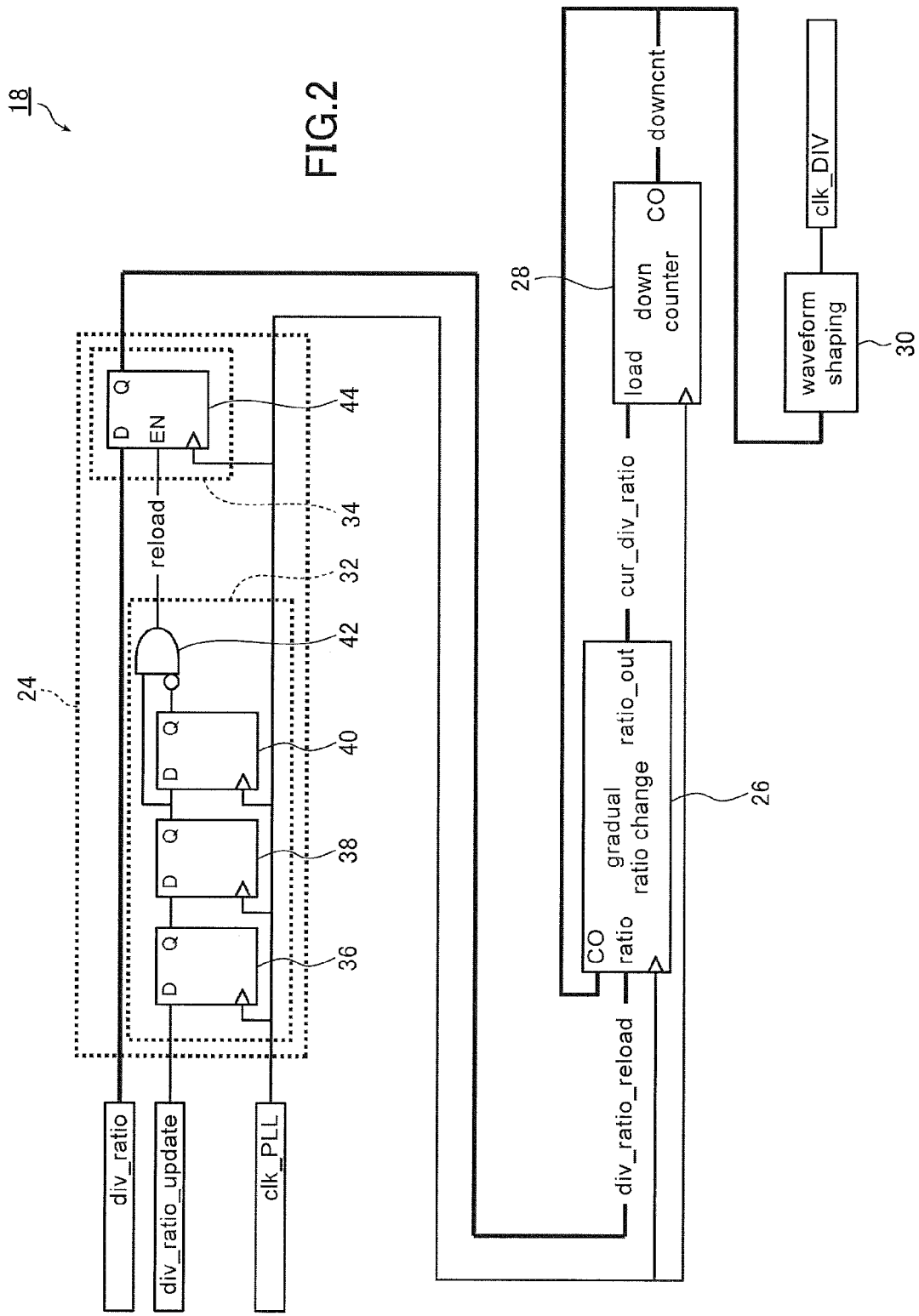
FIG. 2 is a circuit diagram showing an example of the configuration of a frequency divider circuit 18 shown in FIG. 1.

FIG. 2 is a circuit diagram showing an example of the configuration of the frequency divider circuit 18 shown in FIG. 1. The frequency divider circuit 18 shown in FIG. 2 includes a division ratio updating circuit 24, a division ratio changing circuit (gradual ratio change) 26, a down counter (down counter) 28, and a waveform shaping circuit (waveform shaping) 30.

The division ratio setting signal (div_ratio), the division ratio update signal (div_ratio_update), and the reference clock (clk_PLL) are input to the division ratio updating circuit 24.

In synchronization with the reference clock (clk_PLL), the division ratio updating circuit 24 receives the first division ratio set by the division ratio setting signal and inputs the first division ratio to the division ratio changing circuit 26 at a timing controlled by a division ratio update signal.

The division ratio updating circuit 24 shown in FIG. 2 updates the first division ratio set by the division ratio setting signal when the rising (change from low level (L) to high level (H)) of the division ratio update signal is detected.

The division ratio updating circuit 24 includes a change signal detection circuit 32 and a setting signal holding circuit 34. The change signal detection circuit 32 detects the rising of the division ratio update signal in synchronization with the reference clock (clk_PLL) and outputs a reset signal (reload) that becomes an active state when the division ratio update signal rises. When the reset signal (reload) becomes an active state, the setting signal holding circuit 34 holds the division ratio setting signal in synchronization with the reference clock (clk_PLL) and outputs the division ratio setting signal as a division ratio reset signal (div_ratio_reload).

The change signal detection circuit 32 includes three flip-flops (FF) 36, 38 and 40 and an AND circuit 42. The three FFs 36, 38, and 40 are connected in series to each other, and the reference clock (clk_PLL) is input to clock input terminals thereof. The division ratio update signal is input to a data input terminal D of the FF 36 in the first stage. An output signal from a data output terminal Q of the FF 38 in the second stage is input to a non-inverted input terminal of the AND circuit 42, and an output signal from a data output terminal Q of the FF 40 in the third stage is input to an inverted input terminal of the AND circuit 42. The reset signal (reload) is output from the AND circuit 42.

The setting signal holding circuit 34 includes an FF 44. The division ratio setting signal is input to a data input terminal D of the FF 44, the reset signal (reload) is input to an enable input terminal EN of the FF 44, and the reference clock (clk_PLL) is input to a clock input terminal of the FF 44. The division ratio reset signal (div_ratio_reload) is output from a data output terminal Q of the FF 44.

In the division ratio updating circuit 24 shown in FIG. 2, when the division ratio update signal rises, the rising is detected by the change signal detection circuit 32. After two clocks of the reference clock (clk_PLL) from the rising of the division ratio update signal, the reset signal (reload) becomes H of an active state only for the time of one clock. When the reset signal (reload) becomes H of an active state, the division ratio setting signal is held in the setting signal holding circuit 34 in synchronization with the next reference clock (clk_PLL) and is output as the division ratio reset signal (div_ratio_reload).

Then, the reference clock (clk_PLL), a down count value (downcnt) from the down counter 28, and the division ratio reset signal (div_ratio_reload) from the division ratio updating circuit 24 are input to the division ratio changing circuit 26.

The division ratio changing circuit 26 is a circuit for preventing a malfunction due to the recognition of a change in the division ratio of the divided clock being delayed in the division ratio detection circuit 20 when the division ratio of the divided clock is abruptly changed in the frequency divider circuit 18.

The division ratio changing circuit 26 compares the first division ratio set by the division ratio reset signal (division ratio setting signal) with a third division ratio (cur_div_ratio) that is a division ratio of the current divided clock, and changes the third division ratio to the first division ratio in synchronization with the reference clock (clk_PLL) when the first and third division ratios are different.

In the present embodiment, the division ratio changing circuit 26 compares the first division ratio with the third division ratio, and when the first division ratio is smaller than the third division ratio, stepwisely reduces the third division ratio by n (n is an integer of 1 or more), for example, by 1 until the third division ratio becomes the same as the first division ratio, for each predetermined period of the divided clock. On the other hand, when the first division ratio is larger than the third division ratio, the third division ratio is immediately changed to the first division ratio. When the third division ratio is the same as the first division ratio, the third division ratio is not changed.

Then, the reference clock (clk_PLL) and the third division ratio (cur_div_ratio) from the division ratio changing circuit 26 are input to the down counter 28.

In synchronization with the reference clock (clk_PLL), the down counter (first counter) 28 performs counting down from the third division ratio changed by the division ratio changing circuit 26 to the minimum value of 0, and outputs the down count value (downcnt).

Instead of the down counter 28, it is also possible to use an up counter that performs counting up from 0 to the third division ratio and outputs the up count value.

Then, the down count value (downcnt) is input to the waveform shaping circuit 30 from the down counter 28.

The waveform shaping circuit 30 generates the divided clock (clk_DIV) having a duty of approximately 50% from the down count value.

Next, the division ratio detection circuit 20 will be described.

Figure 3:
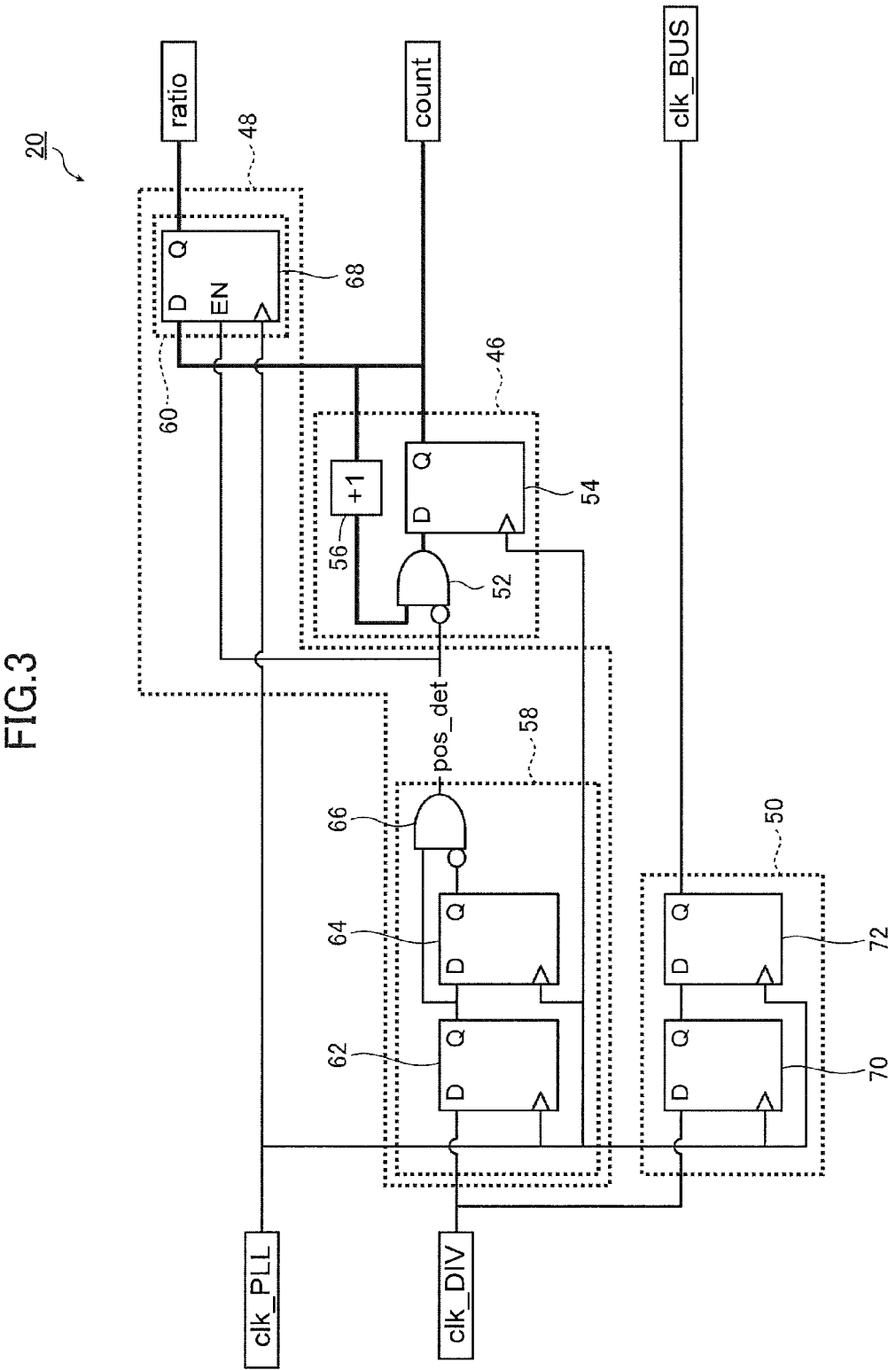
FIG. 3 is a circuit diagram showing an example of the configuration of a division ratio detection circuit 20 shown in FIG. 1.

FIG. 3 is a circuit diagram showing an example of the configuration of the division ratio detection circuit 20 shown in FIG. 1. The division ratio detection circuit 20 shown in FIG. 3 includes an up counter 46, a division ratio determination circuit 48, and a delay circuit 50.

The reference clock (clk_PLL) and a maximum value detection signal (pos_det) from a divided clock detection circuit 58, which will be described later, are input to the up counter 46.

For each period of the divided clock, the up counter (second counter) 46 performs counting up from the minimum value of 0 to the maximum value (third division ratio) in synchronization with the reference clock (clk_PLL), and outputs the up count value (count).

Instead of the up counter 46, it is also possible to use a down counter that performs counting down from the maximum value to 0 and outputs the down count value.

The up counter 46 shown in FIG. 3 includes an AND circuit 52, an FF (counter) 54, and an incrementer (+1) 56. An output signal of the AND circuit 52 is input to a data input terminal D of the FF 54, a reference clock (clk_PLL) is input to a clock input terminal of the FF 54, and the up count value is output from a data output terminal Q of the FF 54. The up count value is input to the incrementer 56. An output signal of the incrementer 56 is input to a non-inverted input terminal of the AND circuit 52, and the maximum value detection signal is input to an inverted input terminal of the AND circuit 52.

In the up counter 46, when the maximum value detection signal becomes H of an active state, the output signal of the AND circuit 52 becomes L. L, which is the output signal of the AND circuit 52, is held in the FF 54 in synchronization with the reference clock (clk_PLL), and the up count value output from the FF 54 becomes 0.

Thereafter, when the maximum value detection signal becomes L of an inactive state, the up count value that is incremented (+1) by the incrementer 56 is output from the AND circuit 52. The output signal from the AND circuit 52 is held in the FF 54 in synchronization with the reference clock (clk_PLL), and the up count value is counted up.

The up count value is incremented sequentially, and counting up from 0 to the maximum value is performed in synchronization with the reference clock (clk_PLL). Then, when the up count value reaches the maximum value and the maximum value detection signal becomes H of an active state again, the up count value becomes 0, and the operation described above is repeated. In the meantime, the up count value is output from the FF 54 (up counter 46).

Then, the reference clock (clk_PLL), the divided clock (clk_DIV), and the up count value (count) from the up counter 46 are input to the division ratio determination circuit 48.

The division ratio determination circuit 48 outputs the maximum value of the up count value as the second division ratio.

The division ratio determination circuit 48 shown in FIG. 3 outputs the maximum value of the up count value as the second division ratio when the rising of the divided clock is detected.

The division ratio determination circuit 48 includes the divided clock detection circuit 58 and a maximum value detection circuit 60. The divided clock detection circuit 58 detects the rising of the divided clock in synchronization with the reference clock (clk_PLL) and outputs the maximum value detection signal (pos_det) that becomes an active state when the divided clock rises. When the maximum value detection signal becomes an active state, the maximum value detection circuit 60 holds the maximum value of the up count value in synchronization with the reference clock (clk_PLL) and outputs the maximum value of the up count value as the second division ratio (ratio).

In addition, the divided clock detection circuit 58 can also detect the falling of the divided clock and output a maximum value detection signal that becomes an active state when the divided clock falls.

The divided clock detection circuit 58 includes two FFs 62 and 64 and an AND circuit 66. The two FFs 62 and 64 are connected in series to each other, and the reference clock (clk_PLL) is input to clock input terminals thereof. The divided clock is input to a data input terminal D of the FF 62 in the first stage. An output signal from a data output terminal Q of the FF 62 in the first stage is input to a non-inverted input terminal of the AND circuit 66, and an output signal from a data output terminal Q of the FF 64 in the second stage is input to an inverted input terminal of the AND circuit 66. The maximum value detection signal is output from the AND circuit 66.

The maximum value detection circuit 60 includes an FF 68. The up count value of the up counter 46 is input to a data input terminal D of the FF 68, the maximum value detection signal is input to an enable input terminal EN of the FF 68, and the reference clock (clk_PLL) is input to a clock input terminal of the FF 68. The second division ratio is output from a data output terminal Q of the FF 68.

In the division ratio determination circuit 48, when the divided clock rises, the rising is detected by the divided clock detection circuit 58. After one clock of the reference clock (clk_PLL) from the rising of the divided clock, the maximum value detection signal becomes H of an active state only for the time of one clock. When the maximum value detection signal becomes H of an active state, the maximum value of the up count value is held in the maximum value detection circuit 60 in synchronization with the next reference clock (clk_PLL) and is output as the second division ratio.

Then, the reference clock (clk_PLL) and the divided clock (clk_DIV) are input to the delay circuit 50.

The delay circuit 50 delays the reference clock (clk_PLL) and outputs the result thereof as the bus clock (clk_BUS).

The delay circuit 50 shown in FIG. 3 includes two FFs 70 and 72. The two FFs 70 and 72 are connected in series to each other, and the reference clock (clk_PLL) is input to clock input terminals thereof. The divided clock is input to a data input terminal D of the FF 70 in the first stage, and an output signal from a data output terminal Q of the FF 72 in the second stage is output as the bus clock (clk_BUS).

In the delay circuit 50, the divided clock is delayed by the time of two clocks of the reference clock (clk_PLL) in synchronization with the reference clock (clk_PLL), and the result thereof is output as the bus clock (clk_BUS).

The reason why the divided clock is delayed by the time of two clocks of the reference clock (clk_PLL) in the present embodiment is that doing so is convenient for assigning the timing for generating the input strobe signal and the output strobe signal in the decoder 22 of the subsequent stage. Therefore, if the decoder 22 is mounted differently from the case of the present embodiment, the number of clocks to delay the divided clock may be different, or the divided clock may not be delayed. In a case where the divided clock is not required to be delayed, the divided clock output from the frequency divider circuit 18 is input to the second device 14 as it is.

Next, the operation of the synchronization system 10 will be described.

First, a case where a divided clock is generated by one-eighth frequency of the reference clock (clk_PLL) will be described.

Figure 4:
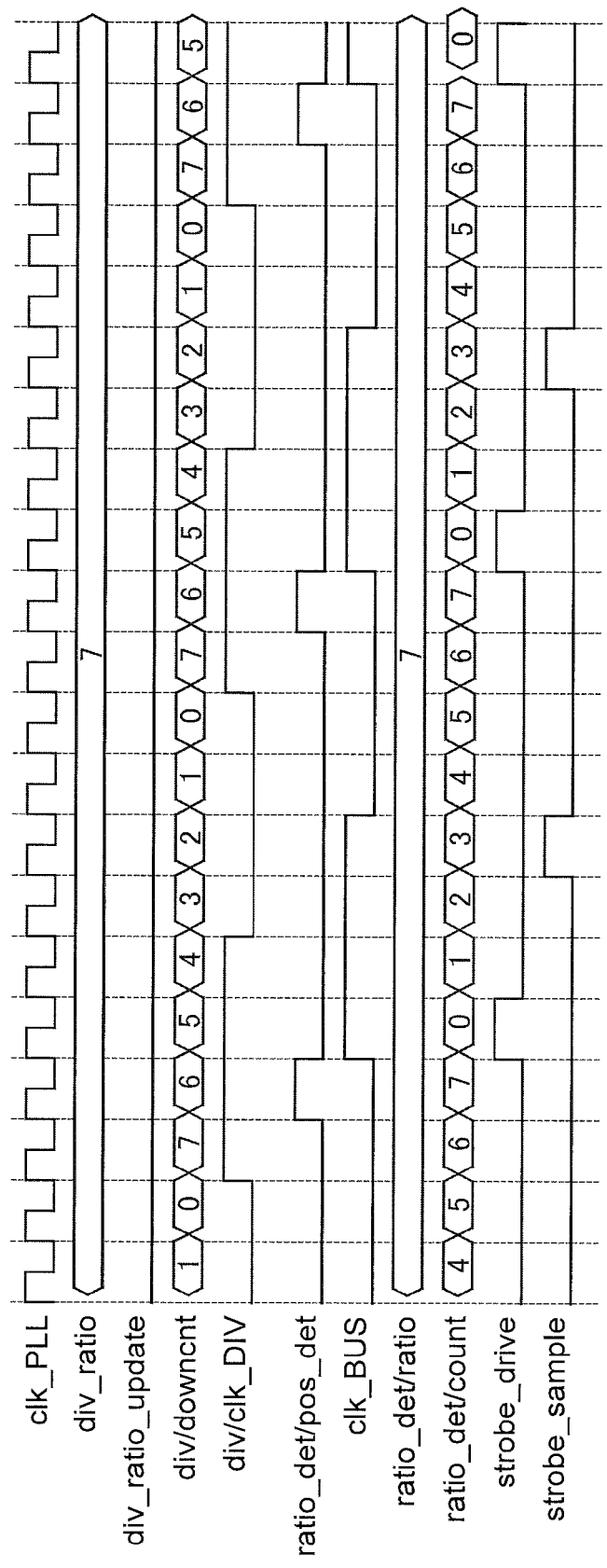
FIG. 4 is a timing chart showing an example of the operation of the synchronization system 10 when the division ratio of the divided clock is 7 (one-eighth frequency).
Figure 5:
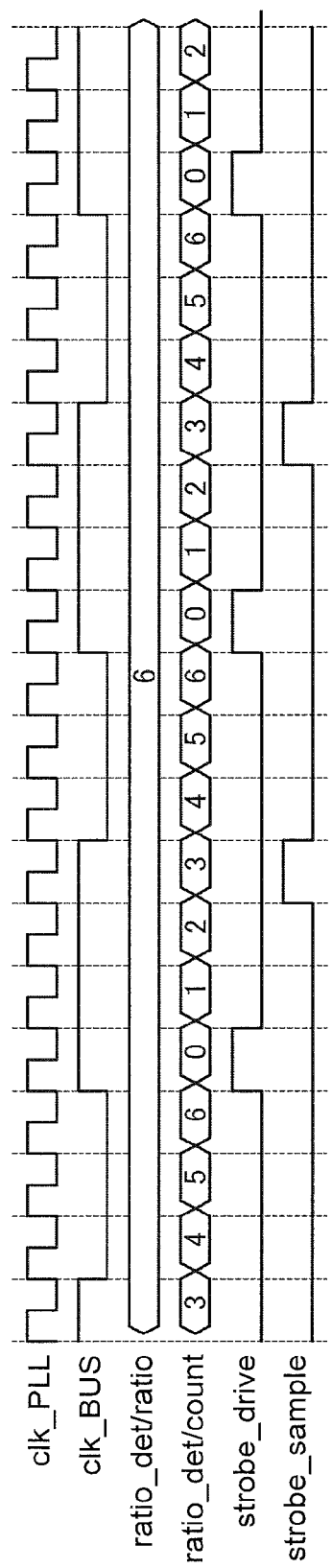
FIG. 5 is a timing chart showing an example of the operation of the synchronization system 10 when the division ratio of the divided clock is 6 (one-seventh frequency).
Figure 6:
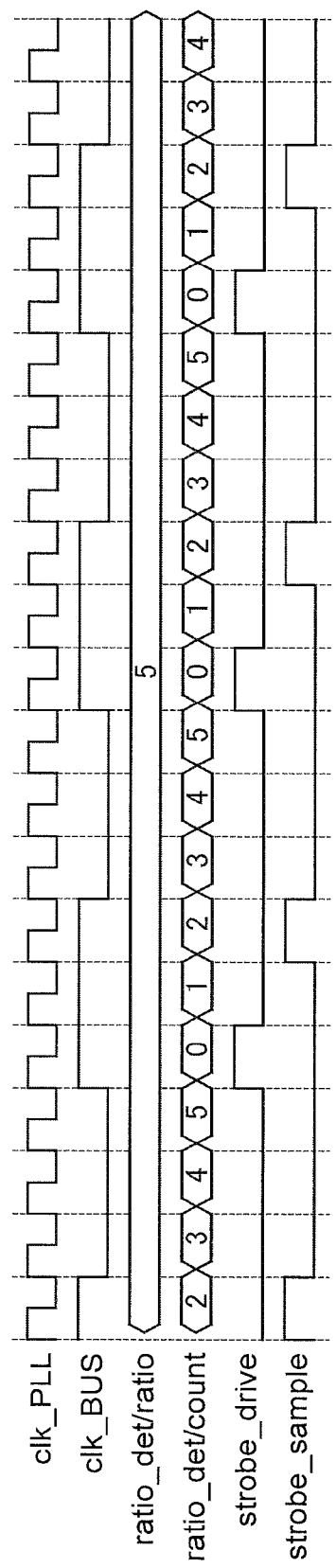
FIG. 6 is a timing chart showing an example of the operation of the synchronization system 10 when the division ratio of the divided clock is 5 (one-sixth frequency).
Figure 7:
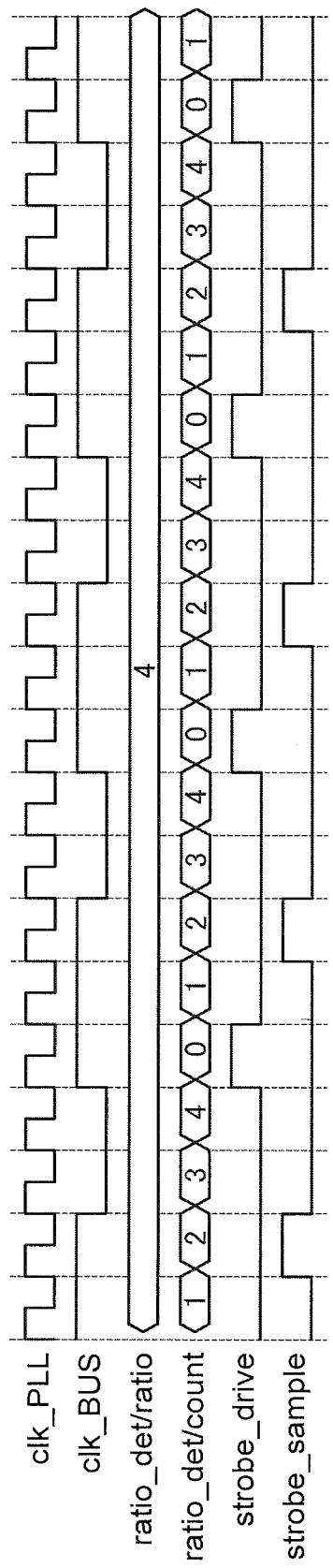
FIG. 7 is a timing chart showing an example of the operation of the synchronization system 10 when the division ratio of the divided clock is 4 (one-fifth frequency).
Figure 8:
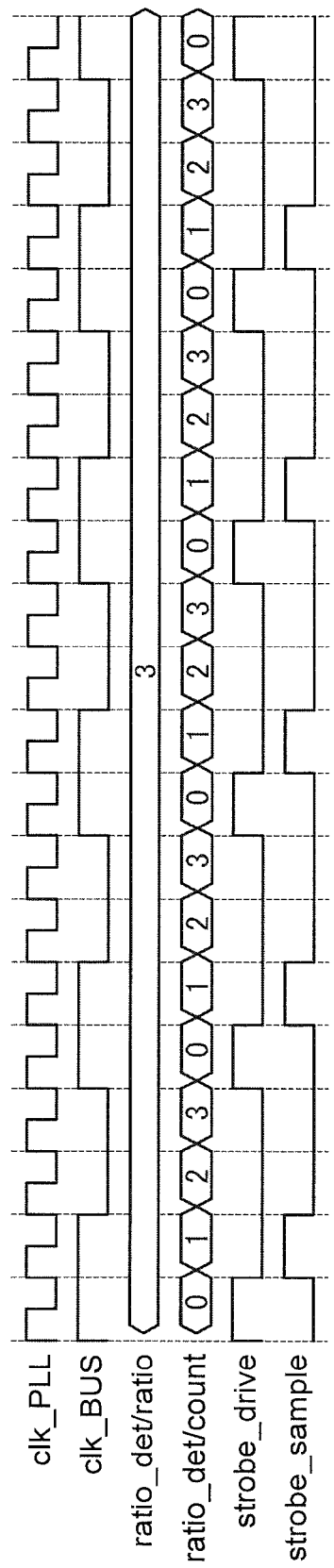
FIG. 8 is a timing chart showing an example of the operation of the synchronization system 10 when the division ratio of the divided clock is 3 (one-fourth frequency).
Figure 9:
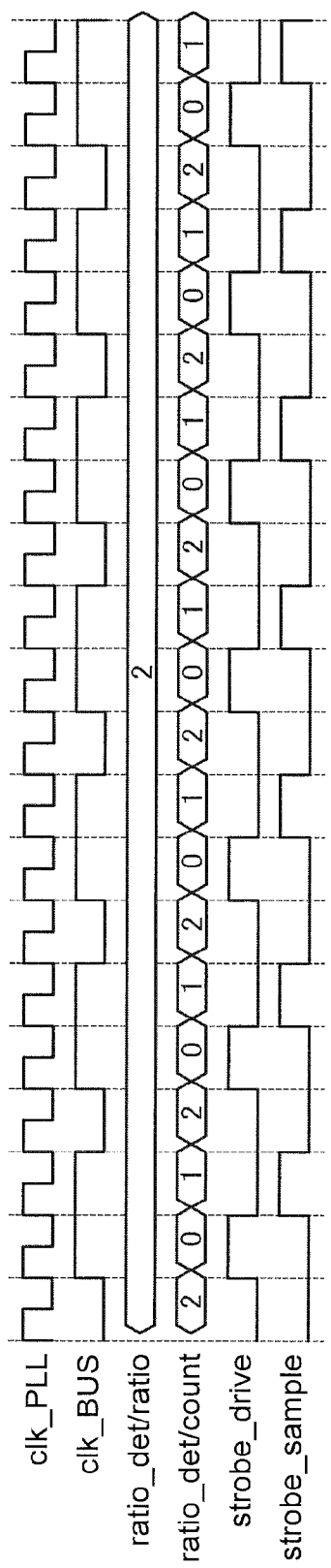
FIG. 9 is a timing chart showing an example of the operation of the synchronization system 10 when the division ratio of the divided clock is 2 (one-third frequency).
Figure 10:
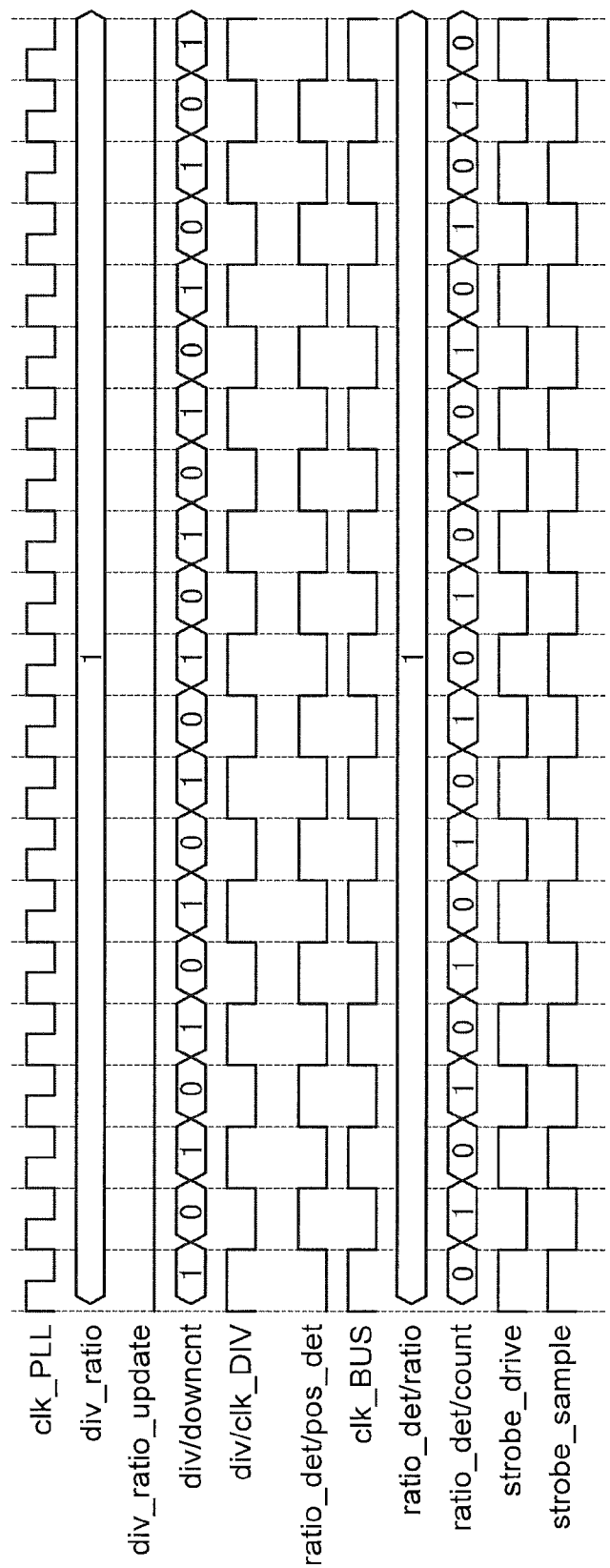
FIG. 10 is a timing chart showing an example of the operation of the synchronization system 10 when the division ratio of the divided clock is 1 (half frequency).

FIG. 4 is a timing chart showing an example of the operation of the synchronization system 10 when the division ratio of the divided clock is 7 (one-eighth frequency). As shown in FIG. 4, the reference clock (clk_PLL) is a clock signal that operates at a predetermined frequency. When generating the divided clock by one-eighth frequency of the reference clock (clk_PLL), the first division ratio set by the division ratio setting signal (div_ratio) is 7.

Although the division ratio update signal (div_ratio_update) is L in FIG. 4, this timing chart shows a state where 7 of the first division ratio is already set as a third division ratio after updating by the division ratio setting signal at a timing controlled by the division ratio update signal.

When the division ratio of the divided clock is 7, it is repeated that the down count value (div/downcnt) of the down counter 28 of the frequency divider circuit 18 is counted down from 7 of the third division ratio to 0.

A divided clock (div/clk_DIV) output from the waveform shaping circuit 30 is H in a period of the counter value of 7 to 4, and it is L in a period of the counter value of 3 to 0. That is, the divided clock is a clock signal of one-eighth frequency of the reference clock (clk_PLL).

When the divided clock (div/clk_DIV) rises, a maximum value detection signal (ratio_det/pos_det) output from the divided clock detection circuit 58 of the division ratio detection circuit 20 becomes H of an active state only for the time of one clock at the next reference clock (clk_PLL).

The bus clock (clk_BUS) output from the delay circuit 50 is a clock signal obtained by delaying the divided clock (div/clk_DIV) by the time of two clocks of the reference clock (clk_PLL).

An up count value (ratio_det/count) becomes 0 at the next reference clock (clk_PLL) when the maximum value detection signal (ratio_det/pos_det) becomes H and then is counted up from 0 to 7 (maximum value) when the maximum value detection signal becomes L, and this is repeated.

A second division ratio (ratio_det/ratio) output from the maximum value detection circuit 60 is a maximum value of the up count value (ratio_det/count) when the maximum value detection signal (ratio_det/pos_det) is H, and is 7 that is the same as the first division ratio.

When the division ratio of the divided clock is 7, the input strobe signal (strobe_sample) and the output strobe signal (strobe_drive) that are output from the decoder 22 are assigned so as to become H only for the time of one clock of the reference clock (clk_PLL) when the up count value becomes 3 and 0, respectively.

As shown in FIGS. 5 to 10, the operation of the synchronization system 10 when the division ratio of the divided clock is 6 to 1 (one-seventh frequency to half frequency) is also the same. Accordingly, the detailed explanation will be omitted.

When the division ratio of the divided clock is 6 (one-seventh frequency), the input strobe signal and the output strobe signal are assigned so as to become H when the up count value is 3 and 0, respectively.

When the division ratio of the divided clock is 5 (one-sixth frequency division) or 4 (one-fifth frequency division), the input strobe signal and the output strobe signal are assigned so as to become H when the up count value is 2 and 0, respectively.

When the division ratio of the divided clock is 3 (one-fourth frequency) or 2 (one-third frequency), the input strobe signal and the output strobe signal are assigned so as to become H when the up count value is 1 and 0, respectively.

When the division ratio of the divided clock is 1 (half frequency), the input strobe signal and the output strobe signal are assigned so as to become H when the up count value is 0.

Next, the operation of the synchronization system 10 when changing the division ratio of the divided clock from 7 (one-eighth frequency) to 5 (one-sixth frequency) will be described.

Figure 11:
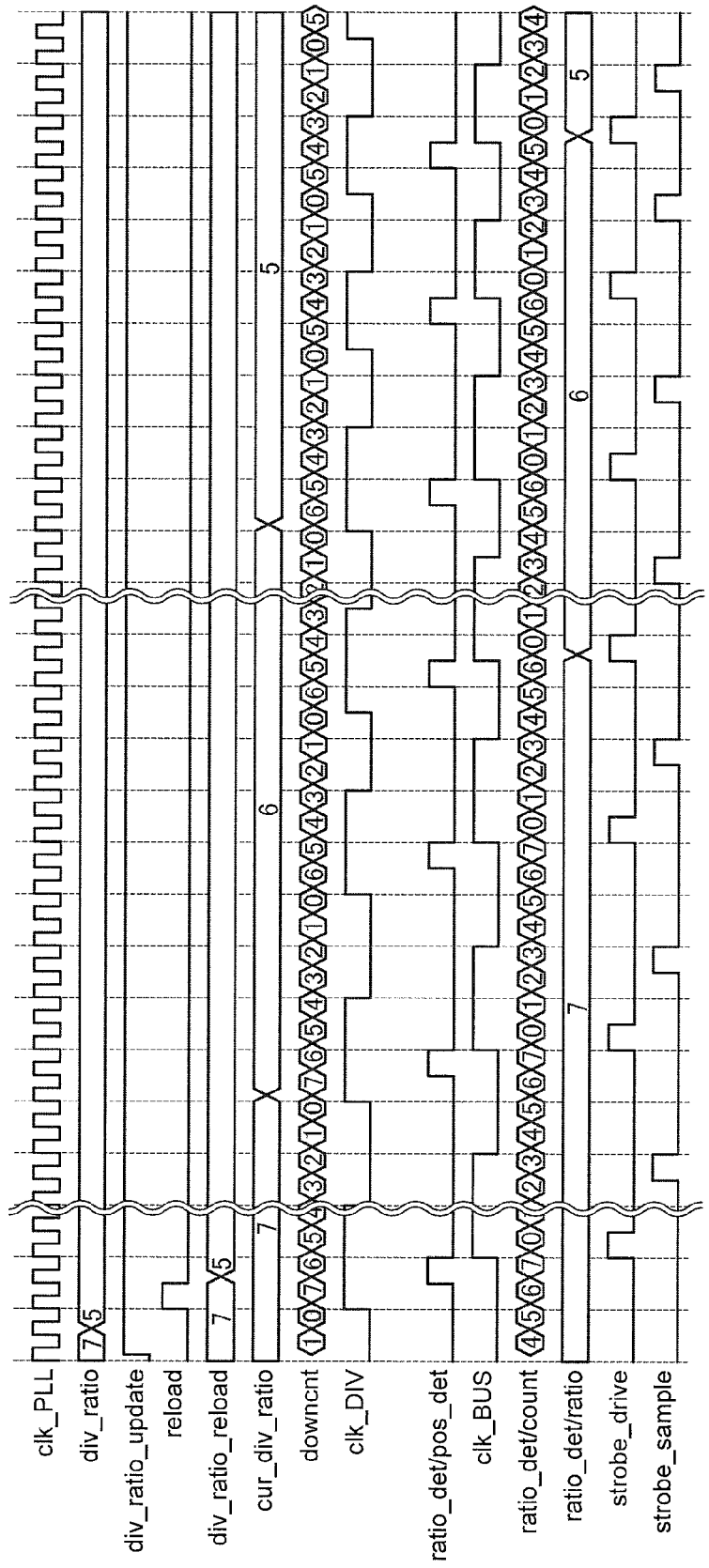
FIG. 11 is a timing chart showing an example of the operation of the synchronization system 10 when changing the division ratio of the divided clock from 7 (one-eighth frequency) to 5 (one-sixth frequency).

FIG. 11 is a timing chart showing an example of the operation of the synchronization system 10 when changing the division ratio of the divided clock from 7 (one-eighth frequency) to 5 (one-sixth frequency). When changing the division ratio of the divided clock from 7 to 5, the first division ratio set by the division ratio setting signal (div_ratio) is changed from 7 to 5 in synchronization with the next reference clock (clk_PLL) after the division ratio update signal (div_ratio_update) rises.

When the division ratio update signal rises, the reset signal (reload) output from the change signal detection circuit 32 of the division ratio updating circuit 24 becomes H only for the time of one clock after two clocks of the reference clock (clk_PLL) from the rising of the division ratio update signal.

When the reset signal (reload) becomes H, the division ratio setting signal is held in the setting signal holding circuit 34 at the next reference clock (clk_PLL). The first division ratio set by the division ratio reset signal (div_ratio_reload) output from the setting signal holding circuit 34 is changed from 7 to 5 at the next reference clock (clk_PLL).

When the first division ratio is changed from 7 to 5, the division ratio changing circuit 26 first counts that the down count value (downcnt) becomes 0 four times, and then 7 of the third division ratio that is a division ratio of the current divided clock is compared with 5 of the first division ratio.

As a result, since the first division ratio is smaller than the third division ratio, the third division ratio after the change (cur_div_ratio) is changed from 7 to 6 at the next reference clock (clk_PLL) when the down count value becomes 0 next. Then, when the down count value becomes 0 four times, the third division ratio is changed from 6 to 5 at the next reference clock (clk_PLL). That is, the third division ratio is periodically reduced by 1.

When the third division ratio is changed from 7 to 6, the down count value is set to 6 of the third division ratio after the change in synchronization with the next reference clock (clk_PLL) after the down count value becomes 0 next. Then, counting down from 6 to 0 is repeated in synchronization with the reference clock (clk_PLL).

Similarly, when the third division ratio is changed from 6 to 5, the down count value is set to 5 of the third division ratio after the change after the down count value becomes 0 next. Then, counting down from 5 to 0 is repeated.

When the third division ratio is 7 (one-eighth frequency), the divided clock (clk_DIV) output from the waveform shaping circuit 30 is H in a period of the down count value of 7 to 4, and it is L in a period of the down count value of 3 to 0. When the third division ratio is changed from 7 to 6 (one-seventh frequency), the divided clock (clk_DIV) output from the waveform shaping circuit 30 is H in a period of the down count value of 6 to 3, and it is L in a period of the down count value of 2 to 0. When the third division ratio is changed from 6 to 5 (one-sixth frequency), the divided clock (clk_DIV) output from the waveform shaping circuit 30 is H in a period of the down count value of 5 to 3, and it is L in a period of the down count value of 2 to 0. That is, when the third division ratio is 5, the divided clock is a clock signal of one-sixth frequency of the reference clock (clk_PLL).

When the third division ratio is changed, the period of the divided clock is changed after the down count value becomes 0 next in accordance with the change in the count period of the down count value.

When the divided clock (div/clk_DIV) rises, the maximum value detection signal (ratio_det/pos_det) output from the divided clock detection circuit 58 of the division ratio detection circuit 20 becomes H of an active state only for the time of one clock at the next reference clock (clk_PLL).

When the third division ratio is changed, the period of the maximum value detection signal is also changed after the down count value becomes 0 next in accordance with the change in the period of the divided clock.

The bus clock (clk_BUS) output from the delay circuit 50 is a clock signal obtained by delaying the divided clock (div/clk_DIV) by the time of two clocks of the reference clock (clk_PLL).

The up count value (ratio_det/count) becomes 0 at the next reference clock (clk_PLL) when the maximum value detection signal (ratio_det/pos_det) becomes H and then is counted up from 0 to the maximum value when the maximum value detection signal becomes L, and this is repeated.

When the third division ratio is changed, the count period of the up count value is changed after the down count value becomes 0 next in accordance with the change in the period of the maximum value detection signal.

The second division ratio (ratio_det/ratio) output from the maximum value detection circuit 60 is a maximum value of the up count value (ratio_det/count) when the maximum value detection signal (ratio_det/pos_det) is H, and is step-wisely changed by 1 in an order of 7 to 5 periodically in accordance with the change in the third division ratio.

When the third division ratio is changed, the second division ratio is changed after the down count value becomes 0 twice in accordance with the change in the count period of the up count value.

When the second division ratio (ratio_det/ratio) is 7 and when the second division ratio is changed from 7 to 6, the input strobe signal (strobe_sample) and the output strobe signal (strobe_drive) that are output from the decoder 22 are assigned so as to become H only for the time of one clock of the reference clock (clk_PLL) when the up count value becomes 3 and 0, respectively. Similarly, when the second division ratio is changed from 6 to 5, the input strobe signal and the output strobe signal are assigned so as to become H only for the time of one clock of the reference clock (clk_PLL) when the up count value becomes 2 and 0, respectively.

Next, the operation of the synchronization system 10 when changing the division ratio of the divided clock from 5 (one-sixth frequency) to 7 (one-eighth frequency) will be described.

Figure 12:
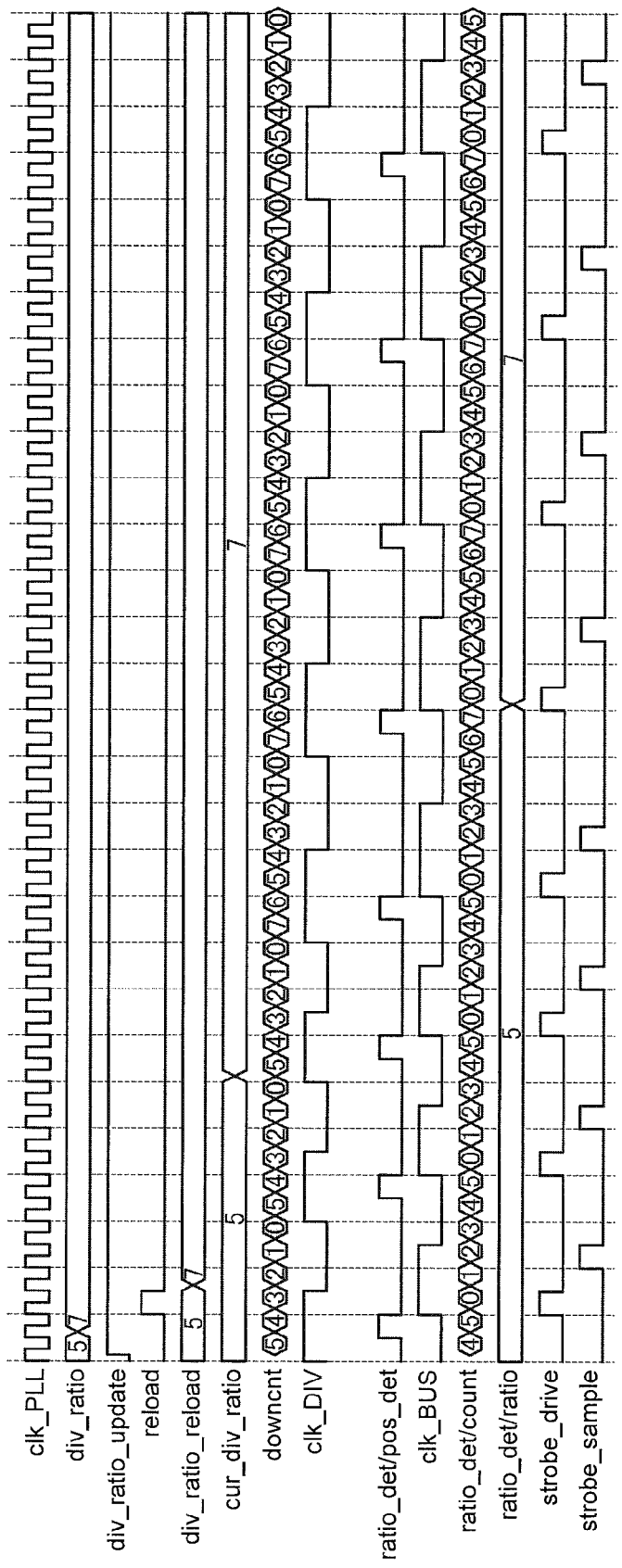
FIG. 12 is a timing chart showing an example of the operation of the synchronization system 10 when changing the division ratio of the divided clock from 5 (one-sixth frequency) to 7 (one-eighth frequency).

FIG. 12 is a timing chart showing an example of the operation of the synchronization system 10 when changing the division ratio of the divided clock from 5 (one-sixth frequency) to 7 (one-eighth frequency). When changing the division ratio of the divided clock from 5 to 7, the first division ratio set by the division ratio setting signal (div_ratio) is changed from 5 to 7 in synchronization with the next reference clock (clk_PLL) after the division ratio update signal (div_ratio_update) rises.

When the division ratio update signal rises, the reset signal (reload) output from the change signal detection circuit 32 of the division ratio updating circuit 24 becomes H only for the time of one clock after two clocks of the reference clock (clk_PLL) from the rising of the division ratio update signal.

When the reset signal (reload) becomes H, the division ratio setting signal is held in the setting signal holding circuit 34 at the next reference clock (clk_PLL), and the first division ratio set by the division ratio reset signal (div_ratio_reload)

output from the setting signal holding circuit 34 is changed from 5 to 7 at the next reference clock (clk_PLL).

When the first division ratio is changed from 5 to 7, the division ratio changing circuit 26 compares 5 of the third division ratio, which is the division ratio of the current divided clock, with 7 of the first division ratio.

As a result, because the first division ratio is larger than the third division ratio, the third division ratio (cur_div_ratio) after the change is changed from 5 to 7 at the next reference clock (clk_PLL) after the down count value (downcnt) becomes 0 twice. That is, the third division ratio is immediately changed to the first division ratio.

When the third division ratio is changed from 5 to 7, the down count value is set to 7 of the third division ratio after the change in synchronization with the next reference clock (clk_PLL) after the down count value becomes 0 next. Then, counting down from 7 to 0 is repeated in synchronization with the reference clock (clk_PLL).

When the third division ratio is 5 (one-sixth frequency), the divided clock (clk_DIV) output from the waveform shaping circuit 30 is H in a period of the down count value of 5 to 3, and it is L in a period of the down count value of 2 to 0. When the third division ratio is changed from 5 to 7 (one-eighth frequency), the divided clock (clk_DIV) output from the waveform shaping circuit 30 is H in a period of the down count value of 7 to 4, and it is L in a period of the down count value of 3 to 0. That is, when the third division ratio is 7, the divided clock is a clock signal of one-eighth frequency of the reference clock (clk_PLL).

When the third division ratio is changed, the period of the divided clock is changed after the down count value becomes 0 next in accordance with the change in the count period of the down count value.

When the divided clock (div/clk_DIV) rises, the maximum value detection signal (ratio_det/pos_det) output from the divided clock detection circuit 58 of the division ratio detection circuit 20 becomes H of an active state only for the time of one clock at the next reference clock (clk_PLL).

When the third division ratio is changed, the period of the maximum value detection signal is also changed after the down count value becomes 0 next in accordance with the change in the period of the divided clock.

The bus clock (clk_BUS) output from the delay circuit 50 is a clock signal obtained by delaying the divided clock (div/clk_DIV) by the time of two clocks of the reference clock (clk_PLL).

The up count value (ratio_det/count) becomes 0 at the next reference clock (clk_PLL) when the maximum value detection signal (ratio_det/pos_det) becomes H and then is counted up from 0 to the maximum value when the maximum value detection signal becomes L, and this is repeated.

When the third division ratio is changed, the count period of the up count value is changed after the down count value becomes 0 next in accordance with the change in the period of the maximum value detection signal.

The second division ratio (ratio_det/ratio) output from the maximum value detection circuit 60 is a maximum value of the up count value (ratio_det/count) when the maximum value detection signal (ratio_det/pos_det) is H, and is immediately changed from 5 to 7 in accordance with the change in the third division ratio.

When the third division ratio is changed, the second division ratio is changed after the down count value becomes 0 twice in accordance with the change in the count period of the up count value.

When the second division ratio (ratio_det/ratio) is 5, the input strobe signal (strobe_sample) and the output strobe signal (strobe_drive) that are output from the decoder 22 are assigned so as to become H only for the time of one clock of the reference clock (clk_PLL) when the up count value becomes 2 and 0, respectively. Similarly, when the second division ratio is changed from 5 to 7, the input strobe signal and the output strobe signal are assigned so as to become H only for the time of one clock of the reference clock (clk_PLL) when the up count value becomes 3 and 0, respectively.

In the synchronization system 10, the following effects can be obtained by detecting the division ratio of the divided clock generated by the frequency divider circuit 18 using the division ratio detection circuit 20.

The division ratio detection circuit 20 does not use the down count value output from the down counter 28 of the frequency divider circuit 18. In addition, the up count value output from the up counter 46 of the division ratio detection circuit 20 is not involved in the generation of the bus clock (divided clock). Therefore, even if CTS is performed in the configuration of the synchronization system 10 shown in FIG. 1, a large clock skew does not occur between the division ratio detection circuit 20 and the first device 12, and timing violation does not occur.

In addition, as shown by the dotted line in FIG. 1, in a case where the frequency divider circuit 18 is mounted as a semiconductor chip different from other circuit portions, multiple-bit signals including the count value output from the frequency divider circuit 88 and the division ratio setting signal need to be input to the decoder 92 in the conventional synchronization system 80. In contrast, in the synchronization system 10 of the present embodiment, only two of the reference clock (clk_PLL) and the divided clock need to be connected between both circuits. Therefore, it is possible to reduce the number of pins for connection between chips. This is advantageous in terms of chip size or substrate design.

Moreover, when distributing the division ratio setting signal to both the frequency divider circuit 88 and the decoder 92 as in the conventional synchronization system 80, the timing for changing the first division ratio set by the division ratio setting signal is very severe. In contrast, in the synchronization system 10 of the present embodiment, the division ratio setting signal is distributed only to the frequency divider circuit 18. Therefore, the division ratio setting signal has no connection with the division ratio detection circuit 20, and thus, it is possible to solve the problem of timing for changing the first division ratio.

In the present embodiment, even if any division ratio of the divided clock is set, the output strobe signal is generated in the cycle of the reference clock (clk_PLL) of the rising of the bus clock (clk_BUS) and the input strobe signal is generated at the reference clock (clk_PLL) one clock before the falling thereof.

For example, when the division ratio of the divided clock is 6, neither the input strobe signal nor the output strobe signal is generated if the up count value is a value of 6, which is the same as the division ratio, or more. The same is true for cases of other division ratios.

Also, even if any division ratio of the divided clock is set, neither the input strobe signal nor the output strobe signal is generated in the cycle of the reference clock (clk_PLL) in which the up count value reaches the maximum value.

The reason for the above is to prevent the occurrence of any problem in a case where the cycle of the reference clock (clk_PLL), in which the up count value reaches the maximum value, may be missing or added during the change of the third division ratio. When changing the third division ratio, the third division ratio is first changed in the frequency divider circuit 18, and the frequency of the divided clock is changed. Then, the change is recognized in the division ratio detection circuit 20, and the frequency of the divided clock is detected. Therefore, there is a case where the division ratio detected in the division ratio detection circuit 20 is still 8 while the division ratio of the divided clock is 7 or 9, for example.

However, even in such a case, if the input strobe signal and the output strobe signal are not generated in the cycle of the reference clock (clk_PLL) in which the up count value reaches the maximum value, the synchronization system 10 can operate normally.

For example, as shown in FIG. 11, when changing the division ratio of the divided clock from 7 to 5, 7 and 6 of the up count value are missing whenever the third division ratio is changed. In addition, as shown in FIG. 12, when changing the division ratio of the divided clock from 5 to 7, 6 and 7 of the up count value are added whenever the third division ratio is changed.

However, in both cases, the input strobe signal and the output strobe signal are always generated alternately. Therefore, no problem occurs in the operation of the synchronization system 10.

In addition, the division ratio changing circuit 26 can also reduce the third division ratio by 2 or more periodically when the first division ratio is smaller than the third division ratio. For example, when it is required to reduce the third division ratio by 2 at a time, the input strobe signal and the output strobe signal may be assigned so as not to be generated not only in the cycle of the reference clock (clk_PLL) in which the up count value reaches the maximum value but also in the cycle of the reference clock (clk_PLL) one clock before the cycle.

That is, in a case where the first division ratio is smaller than the third division ratio, and the division ratio changing circuit 26 stepwisely reduces the third division ratio by m (m is an integer of 2 or more) for each predetermined period of the divided clock until the third division ratio becomes the same as the first division ratio, the decoder 22 may assign strobe signals such that no strobe signals are generated in the cycles of the reference clock (clk_PLL) from the maximum value to (maximum value−(m−1)) of the up count value.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A synchronization system, comprising:
a frequency divider circuit that generates a divided clock by dividing a reference clock in a first division ratio set by a division ratio setting signal;
a first device that operates in synchronization with the reference clock;
a second device that operates in synchronization with the divided clock;
a division ratio detection circuit that, for each period of the divided clock, outputs a count value counted in synchronization with the reference clock, and detects a division ratio of the divided clock based on the count value and output the division ratio as a second division ratio; and
a decoder that generates a strobe signal, which is for controlling a timing at which the first device transmits and receives a signal to and from the second device, based on the count value and the second division ratio,
wherein the first device communicates with the second device through a bus, which operates in synchronization with the divided clock, based on the strobe signal.

2. The synchronization system according to claim 1, wherein the frequency divider circuit comprises:
a division ratio changing circuit that changes a third division ratio, which is a division ratio of the current divided clock, to the first division ratio;
a first counter that outputs a count value, which is obtained by counting the third division ratio changed by the division ratio changing circuit, in synchronization with the reference clock; and
a waveform shaping circuit that generates the divided clock having a duty of approximately 50% from the count value of the first counter.

3. The synchronization system according to claim 2, wherein the division ratio changing circuit stepwisely reduces the third division ratio by n (n is an integer of 1 or more) until the third division ratio becomes a same as the first division ratio, for each predetermined period of the divided clock, when the first division ratio is smaller than the third division ratio, immediately changes the third division ratio to the first division ratio when the first division ratio is larger than the third division ratio, and does not change the third division ratio when the third division ratio is the same as the first division ratio.

4. The synchronization system according to claim 2, wherein the frequency divider circuit includes a division ratio updating circuit configured to receive the first division ratio set by the division ratio setting signal and input the first division ratio to the division ratio changing circuit at a timing controlled by a division ratio update signal.

5. The synchronization system according to claim 1, wherein the division ratio detection circuit comprises:
a second counter that outputs a count value, which is counted in synchronization with the reference clock, for each period of the divided clock; and
a division ratio determination circuit that outputs a maximum value of the count value of the second counter as the second division ratio.

6. The synchronization system according to claim 5, wherein the division ratio determination circuit comprises:
a divided clock detection circuit that detects rising or falling of the divided clock in synchronization with the reference clock and output a maximum value detection signal that becomes an active state when the rising or falling of the divided clock is detected; and
a maximum value detection circuit that holds the maximum value of the count value of the second counter in synchronization with the reference clock and output the maximum value of the count value of the second counter as the second division ratio, when the maximum value detection signal becomes an active state.

7. The synchronization system according to claim 5, wherein the decoder does not generate the strobe signal in a cycle of the reference clock in which the count value of the second counter reaches the maximum value.

8. The synchronization system according to claim 5, wherein, when the first division ratio is smaller than a third division ratio, which is a division ratio of the current divided clock, the division ratio changing circuit stepwisely reduces the third division ratio by m (m is an integer of 2 or more) until the third division ratio becomes a same as the first division ratio, for each predetermined period of the divided clock, and the decoder does not generate the strobe signal in cycles of the reference clock from a maximum value to (the maximum value−(m−1)) of the count value of the second counter.

9. A frequency divider circuit used in the synchronization system according to claim 1.

10. A frequency divider circuit that generates a divided clock by dividing a reference clock in a first division ratio set by a division ratio setting signal, comprising:

a division ratio updating circuit that receives the first division ratio set by the division ratio setting signal at a timing controlled by a division ratio update signal;

a division ratio changing circuit that changes a third division ratio, which is a division ratio of the current divided clock, to the first division ratio received by the division ratio updating circuit;

a first counter that outputs a count value, which is obtained by counting the third division ratio changed by the division ratio changing circuit, in synchronization with the reference clock; and a waveform shaping circuit that generates the divided clock having a duty of approximately 50% from the count value of the first counter, wherein the division ratio changing circuit stepwisely reduces the third division ratio by n (n is an integer of 1 or more) until the third division ratio becomes a same as the first division ratio, for each predetermined period of the divided clock, when the first division ratio is smaller than the third division ratio, immediately changes the third division ratio to the first division ratio when the first division ratio is larger than the third division ratio, and does not change the third division ratio when the first division ratio is the same as the third division ratio.

* * * * *